(12) United States Patent
Divakaruni et al.

(10) Patent No.: US 6,440,793 B1
(45) Date of Patent: Aug. 27, 2002

(54) VERTICAL MOSFET

(75) Inventors: Ramachandra Divakaruni, Somers, NY (US); Heon Lee, Sunnyvale, CA (US); Jack A. Mandelman, Stormville, NY (US); Carl J. Radens, LaGrangeville, NY (US); Jai-Hoon Sim, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 09/757,514

(22) Filed: Jan. 10, 2001

(51) Int. Cl.$^7$ .......................................... H01L 21/8242
(52) U.S. Cl. ....................... 438/243; 438/272; 438/525; 438/589; 438/244; 438/246
(58) Field of Search .................................. 438/243, 244, 438/246, 247, 249, 272, 525, 589, FOR 192, FOR 212

(56) References Cited

U.S. PATENT DOCUMENTS

| | | | |
|---|---|---|---|
| 5,827,765 A | 10/1998 | Stengl et al. | 438/243 |
| 5,981,332 A | 11/1999 | Mandelman et al. | 438/246 |
| 6,143,599 A | * 11/2000 | Kim et al. | |
| 6,156,607 A | * 12/2000 | Noble et al. | |
| 6,200,873 B1 | * 3/2001 | Schrems et al. | |
| 6,261,894 B1 | * 7/2001 | Mandelman et al. | |
| 6,297,089 B1 | * 10/2001 | Coronel et al. | |
| 6,326,261 B1 | * 12/2001 | Tsang et al. | |
| 6,373,091 B2 | * 4/2002 | Horak et al. | |

* cited by examiner

Primary Examiner—George Fourson
Assistant Examiner—Joannie Adelle Garcia
(74) Attorney, Agent, or Firm—Ira Blecker; Cantor Colburn LLP

(57) ABSTRACT

An improved process for making a vertical MOSFET structure comprising: A method of forming a semiconductor memory cell array structure comprising: providing a vertical MOSFET DRAM cell structure having a deposited gate conductor layer planarized to a top surface of a trench top oxide on the overlying silicon substrate; forming a recess in the gate conductor layer below the top surface of the silicon substrate; implanting N-type dopant species through the recess at an angle to form doping pockets in the array P-well; depositing an oxide layer into the recess and etching said oxide layer to form spacers on sidewalls of the recess; depositing a gate conductor material into said recess and planarizing said gate conductor to said top surface of the trench top oxide.

6 Claims, 5 Drawing Sheets

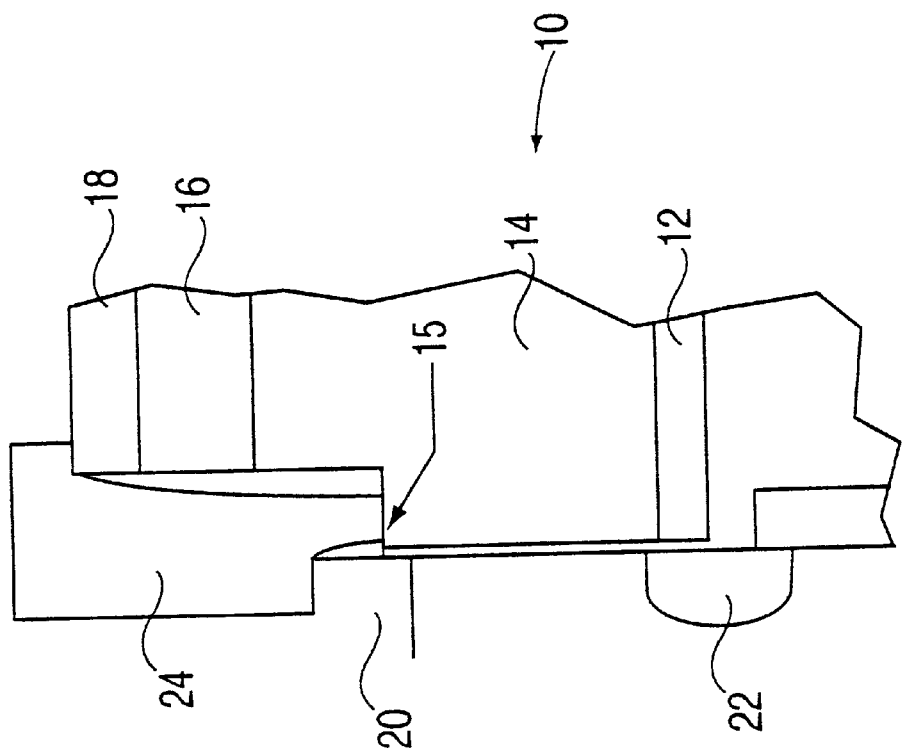
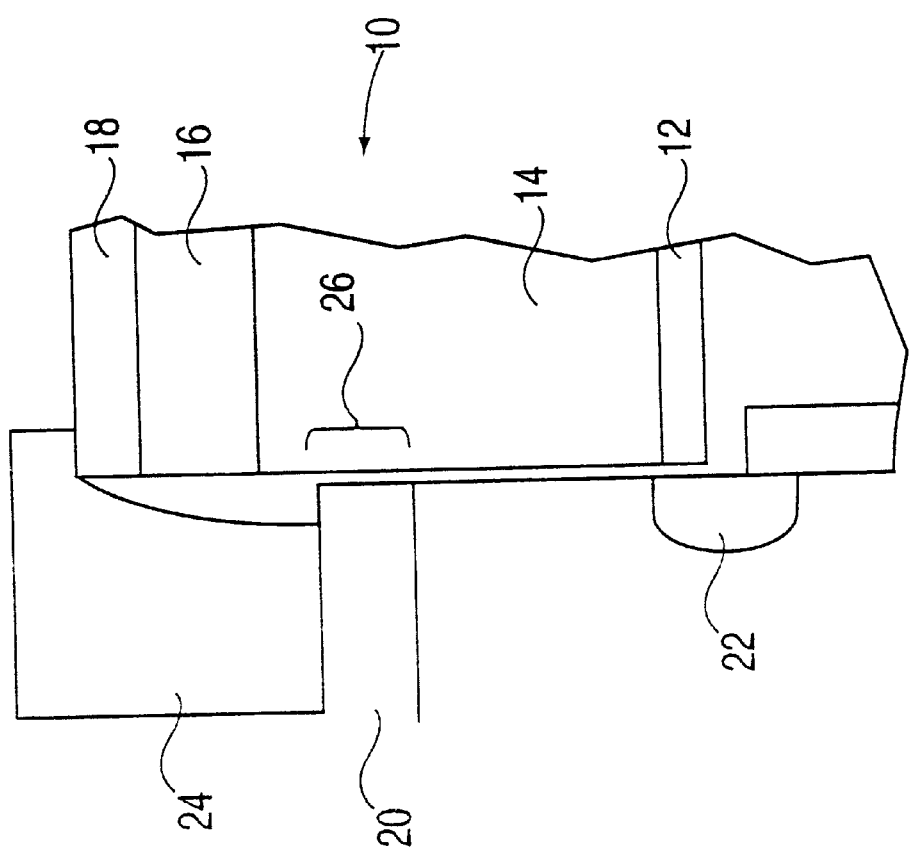

VERTICAL MOSFET

BACKGROUND OF THE INVENTION

The present invention relates to the fabrication of improved vertical metal oxide semiconductor field effect transistors (MOSFETs).

A MOSFET is used in forming dynamic random access memory (DRAM). A DRAM circuit usually will include an array of memory cells interconnected by rows and columns, which are known as wordlines and bitlines, respectively. Reading data from or writing data to memory cells is achieved by activating selected wordlines and bitlines. Typically, a DRAM memory cell comprises a MOSFET connected to a capacitor. The capacitor includes gate and diffusion regions which are referred to as either drain or source regions, depending on the operation of the transistor.

There are different types of MOSFETs. A planar MOSFET is a transistor where a surface of the channel region of the transistor is generally parallel to the primary surface of the substrate. A vertical MOSFET is a transistor where a surface of the channel region of the transistor is generally perpendicular to the primary surface of the substrate. A trench MOSFET is a transistor where a surface of the channel region of the transistor is not parallel to the primary surface of the substrate and the channel region lies within the substrate. For a trench MOSFET, the surface of the channel region is usually perpendicular to the primary surface, although this is not required.

Specifically, trench capacitors are frequently used with DRAM cells. A trench capacitor is a three-dimensional structure formed into a silicon substrate. This is normally formed by etching trenches of various dimensions into the silicon substrate. Trenches commonly have N+ doped polysilicon as one plate of the capacitor (a storage node). The other plate of the capacitor is formed usually by diffusing N+ dopants out from a dopant source into a portion of the substrate surrounding the lower part of the trench. Between these two plates, a dielectric layer is placed which thereby forms the capacitor.

To prevent carriers from traveling through the substrate between the adjacent devices, e.g. capacitors, device isolation regions are formed between adjacent semiconductor devices. Generally, device isolation regions take the form of thick field oxide regions extending below the surface of the semiconductor substrate. The most common early technique for forming a field oxide region is the local oxidation of silicon ("LOCOS") technique. LOCOS field oxidation regions are formed by first depositing a layer of silicon nitride ("nitride") on the substrate surface and then selectively etching a portion of the silicon nitride layer to form a mask exposing the substrate where the field oxidation will be formed. The masked substrate is placed in an oxidation environment and a thick silicon oxide layer is grown at the regions exposed by the mask, forming an oxide layer extending above and below the surface of the substrate. An alternative to LOCOS field oxidation is the use of shallow trench isolation ("STI"). In STI, a sharply defined trench is formed in the semiconductor substrate by, for example, anisotropic etching. The trench is filled with oxide back to the surface of the substrate to provide a device isolation region. Trench isolation regions formed by STI have the advantages of providing device isolation across their entire lateral extent and of providing a more planar structure. Using improved isolation, continued reductions in size are possible.

DRAM technology for 1 Gb and beyond requires the use of vertical MOSFETs to overcome the scalability limitations of planar MOSFET DRAM access transistors. However, although vertical MOSFETs allow the bit densities required for effective size reduction, the use of vertical MOSFETs may result in performance and yield reduction tradeoffs.

For example, as the result of increased gate conductor to bitline diffusion overlap area, total bitline capacitance may be larger with vertical MOSFETs than with conventional planar MOSFET structures. Such a prior art structure is shown in FIG. 1 which is a cross-sectional view of a vertical MOSFET in which the vertical gate conductor 10 overlaps the entire depth of the bitline diffusion 20. Prior art attempts to address this concern generally require that the depth of the bitline diffusion be minimized. However, minimization of bitline diffusion depth is complicated by the fact that integration requirements may dictate a relatively high thermal budget (i.e., bitline diffusion (XA) needing to be performed relatively early in the process).

An additional concern encountered with vertical MOSFETs is the occurrence of diffusion stud (CB) to gate conductor (DT) shorts. These short circuits may result from misalignment between the edge of the wordline (WL) 16 and the edge of the deep trench 15, as shown in FIG. 2.

Yet another chronic problem with vertical MOSFETs is parasitic backside conduction. This issue arises as the distance between deep trench sidewalls is scaled below 100 nm. At this proximity, the adjacent wordline exerts an increasing influence on the potential in the silicon in the body of the vertical MOSFET. This influence increases the likelihood of leakage conduction between the storage node 22 and bitline diffusions 20, as illustrated in FIG. 3. When the adjacent wordline is high, it maybe possible to form a weakly inverted conductive path on the backside of the vertical MOSFET.

What is needed is a process for fabricating a scalable vertical MOSFET structure with minimized adverse performance and yield impacts.

SUMMARY OF THE INVENTION

Now, according to the present invention, an improved process for making a vertical MOSFET structure has been developed which features reduced gate to top diffusion overlap capacitance (reduced bitline capacitance), reduced bitline diffusion area, reduced incidence of diffusion to gate shorts (reduced incidence of CB-DT shorts), and improved immunity to backside parasitic conduction.

The improved vertical MOSFET structure is accomplished by a process wherein the gate conductor polysilicon of the DRAM array first is recessed below the top surface of the silicon substrate. This recessing operation maybe performed using any one of a variety of conventional etching techniques, such as wet etching, chemical dry etching (CDE), plasma etching, and the like. An angled implant of an N-type dopant species then is made through the exposed gate dielectric and into the deep trench sidewall which will contain the gated surface of the vertical MOSFET. This implant forms an N-type. doping pocket in the array P-well. At a subsequent processing step, this N-type doping pocket will link up with the outdiffusion from the bitline contact stud, providing an electrical connection between the bitline and the upper source/drain diffusion of the vertical MOSFET. It should be noted that this N-type doping pocket is self-aligned with the edge of the gate conductor. As the result of this self-alignment, there essentially are no variations in gate to diffusion overlap capacitance. Following the angled implant of the N-type dopant species, an oxide, optionally, may be grown to reduce the surface state concentration. Then, a chemical vapor deposition (CVD) oxide may be deposited and reactive ion etched (REE'd), forming spacers on the sidewalls of the apertures above the deep trenches.

An additional layer of an N+ doped polysilicon then is deposited and planarized to the top surface of the high-density plasma (HDP) oxide. Standard processing steps follow that include formation of wordlines, bitline studs (CBs), interlevel dielectrics, and additional wiring levels.

In another embodiment of the present invention, the array gate conductor polysilicon first is recessed below the top surface of the silicon substrate, in the same manner as described above. Then, an arsenic-silicate glass (ASG), or other suitable N-type doped glass, is deposited and reactive-ion etched to form doped glass spacers on the sidewalls of the apertures above the deep trenches. Subsequent hot process steps (for example, junction anneal steps) will cause the dopant from the N-type doped glass to outdiffuse into the silicon of the deep trench sidewall which will contain the gated surface of the vertical MOSFET, then forming N-type bitline diffusion pockets in the array P-well.

As described above in reference to the previous embodiment, an additional layer of N+ doped polysilicon then is deposited and planarized to the top surface of the HDP oxide. Standard, conventional processing then follows, including formation of wordlines, bitline studs, interlevel dielectrics, and additional wiring levels.

The resulting improved vertical MOSFET structure reduces the incidence of shorts between the diffusion stud and the gate conductor, since the structure now contains an additional spacer (in addition to the wordlines spacers) between the bitline diffusion and the gate conductor. Another advantage of the present improved vertical MOSFET structure is the formation of an asymmetric bitline diffusion, such that the bitline diffusion intersects the gated surface of the MOSFET but does not intersect the backside surface of the MOSFET. The asymmetry in the bitline diffusion provides increased electric potential barrier in the parasitic conduction path on the back surface of the MOSFET. Furthermore, since the length of the diffusion is reduced relative to the structures of the prior art, drain induced barrier lowering (DIBL) is reduced as well. Reduced DIBL results in reduced sensitivity of device electrical characteristics to variations in the channel length of the vertical MOSFET (resulting from variations in DT storage node polysilicon recess).

It also should be noted that during the entire processing procedure to form the improved vertical MOSFET structure, as described in both embodiments above, the peripheral support areas of the chip are continuously protected by the top layer of HDP oxide, thus requiring no additional masking techniques during the processing.

BRIEF DESCRIPTION OF THE DRAWINGS

FIGS. 1–3 illustrate prior art embodiments of vertical MOSFET structures.

DETAILED DESCRIPTION OF PREFERRED EMBODIMENTS

Figure 4:
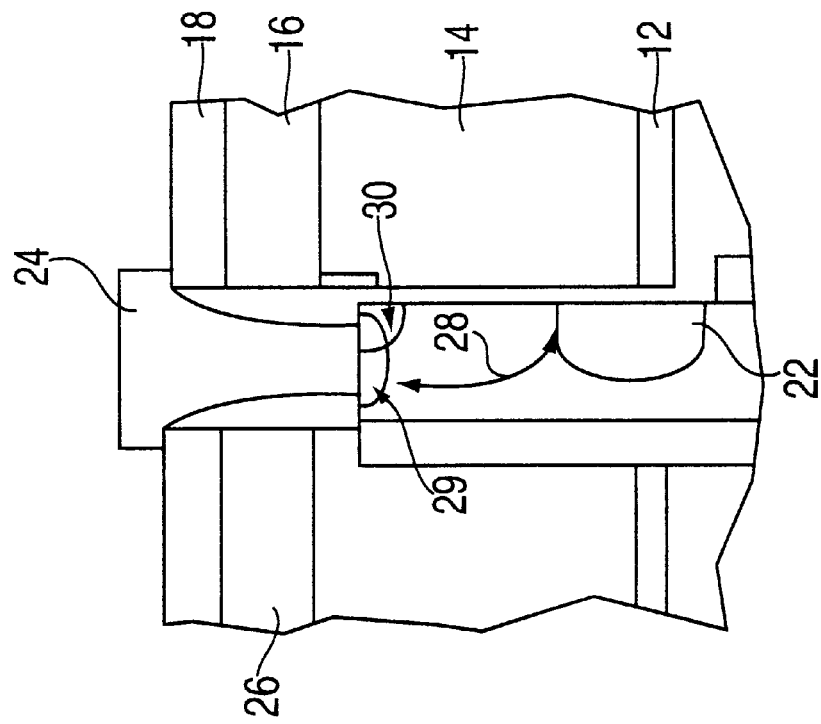
FIG. 4 depicts the improved vertical MOSFET structure of the present invention, featuring advantages over the prior art.

Referring now to FIG. 1, a prior art vertical MOSFET structure 10 is shown including trench top oxide (TTO) layer 12, gate conductor (GC) 14, wordline (WL) 16, nitride cap 18, bitline diffusion (XA) 20, storage node diffusion 22, and diffusion stud 24. The large overlap 26 of the vertical gate conductor 14 over the entire depth of the bitline diffusion 20 results in a larger total bitline capacitance with this vertical MOSFET then with a conventional planar MOSFET.

In FIG. 2, another prior art vertical MOSFET structure is shown which illustrates a misalignment between the edge of the wordline 16 and the edge of the deep trench. This results in the occurrence of diffusion stud 24 to gate conductor shorts, as indicated at 15.

Figure 3:
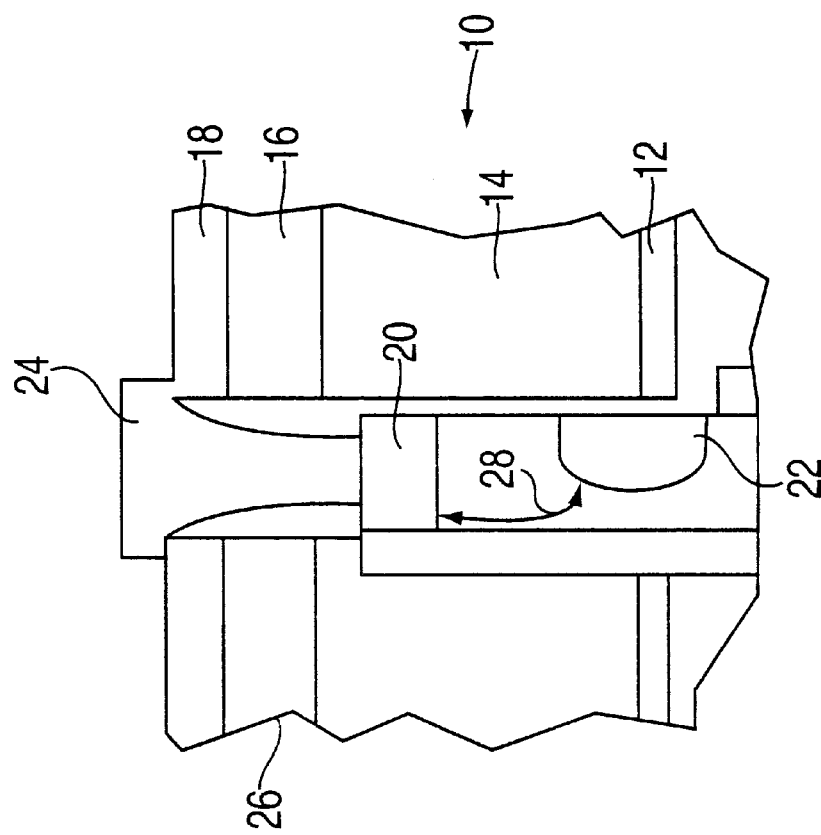

FIG. 3 also shows a prior art vertical MOSFET structure illustrating possible backside parasitic conduction problems. As the distance between the deep trench sidewalls is scaled below 100 nm, the adjacent wordline 26 has an increasing influence on the potential in the silicon in the body of the vertical MOSFET 10. This increases the likelihood of conduction between storage node 22 and bitline diffusions 20, as depicted by double sided arrow 28.

FIG. 4 shows the improved vertical MOSFET structure of the present invention with the improved structure, including N-type doping pocket 30, the bitline diffusion (20 in FIG. 3) does not intersect the backside of the MOSFET, thus impeding the parasitic current 28. Reduced bitline diffusion area 29 further results in decreased DIEBL and a further reduction in bitline diffusion capacitance.

Figure 5:
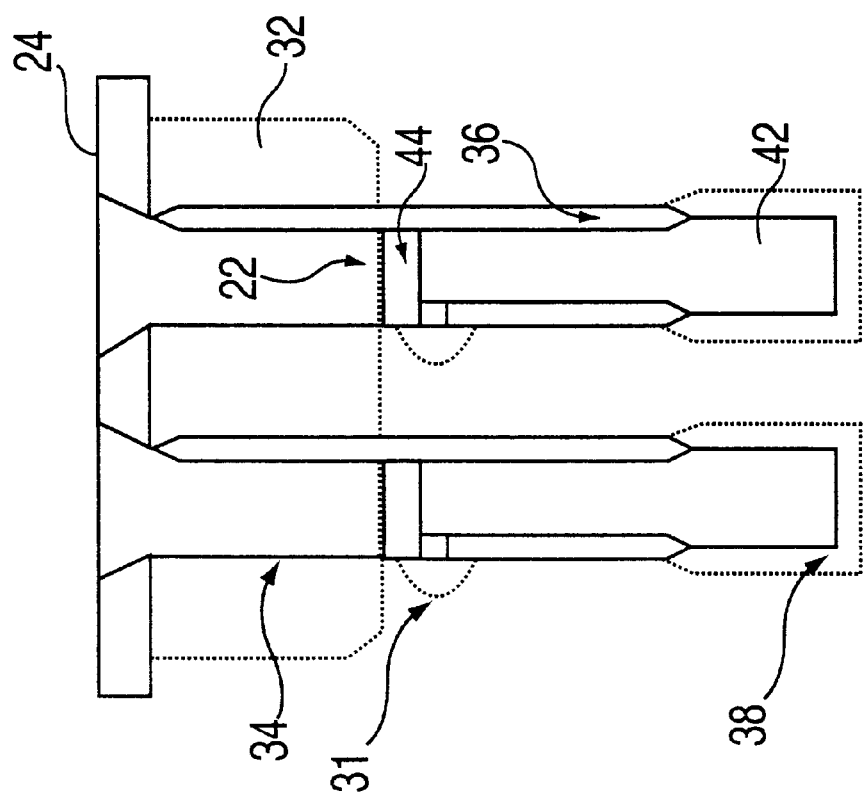

FIG. 5 shows a vertical MOSFET DRAM cell formed in substrate 20 fabricated using standard processing techniques through planarization of the array MOSFET gate conductor polysilicon 22 to the top surface of the trench top oxide (TTO) layer 24. Such standard processing typically includes the following steps:

1) Starting with a silicon substrate, a pad structure consisting of a thin thermal oxide (2–20 nm) is grown on the silicon substrate; a deposited layer of silicon nitride (50–200 nm), a layer of densified TEOS oxide (or HDP oxide) (50–500 nm), and a deposited top layer of BSG oxide (50–500 nm) then is formed.

2) Deep trench storage capacitors are then formed in the customarily practiced manner by opening the trench pattern in the pad structure and anisotropically etching the silicon to a depth of approximately 7 micrometers.

3) A poly buffered LOCOS collar 36 (or other type of oxide collar) is formed in the upper portion (approx top 1 micrometers).

4) A buried plate diffusion is formed in the lower portion of the storage trench, using any one of a number of well known methods (e.g. outdiffusion from an ASG glass, gas phase doping and the like).

5) A storage node dielectric 38 is formed.

6) The trench is filled with N+ doped polysilicon 42 which is then planarized to the densified TEOS oxide layer and BSG layers. Any remaining BSG maybe stripped with HF/Sulfuric acid or HF vapor.

7) The N+ doped poly is recessed to a depth below the surface of the silicon substrate at which it is desired to form a buried-strap.

8) A standard buried-strap process is used to form a strap outdiffusion 31 from the N+ poly into the sidewall of the deep storage trench. The standard strap process includes the removal of the collar oxide from one side of the storage trench, above the point at which the strap is to be formed, and deposition and etching of the strap polysilicon. The strap polysilicon electrically bridges the N+ poly in the deep trench (storage node electrode of the capacitor) to the single crystal silicon. A strap outdiffusion is subsequently formed in the course of processing at elevated temperatures.

9) The pad layers (SiN and underlying thin oxide) are then removed by standard etch processes.

10) A sacrificial oxide is grown on the trench sidewall and top surface of the silicon substrate.

11) N+ bitline diffusion (XA) and array well (VA) 32 implants are made through the sacrificial oxide.

12) The sacrificial oxide is stripped.

13) A trench top oxide (TTO) 44 is formed on the top surface of the recessed N+ poly, by HDP oxide deposition.

14) A gate oxide 34 for the vertical array MOSFET is grown on the exposed (portion not covered. by the collar oxide) sidewall of the storage trench.

15) N+ polysilicon gate conductor (GC) 22 is deposited, filling the aperture in the trench above the TTO.

16) The N+ GC poly 22 is then planarized to the top surface of the TTO 24 which had been formed on the top surface of the silicon substrate.

Figure 6:
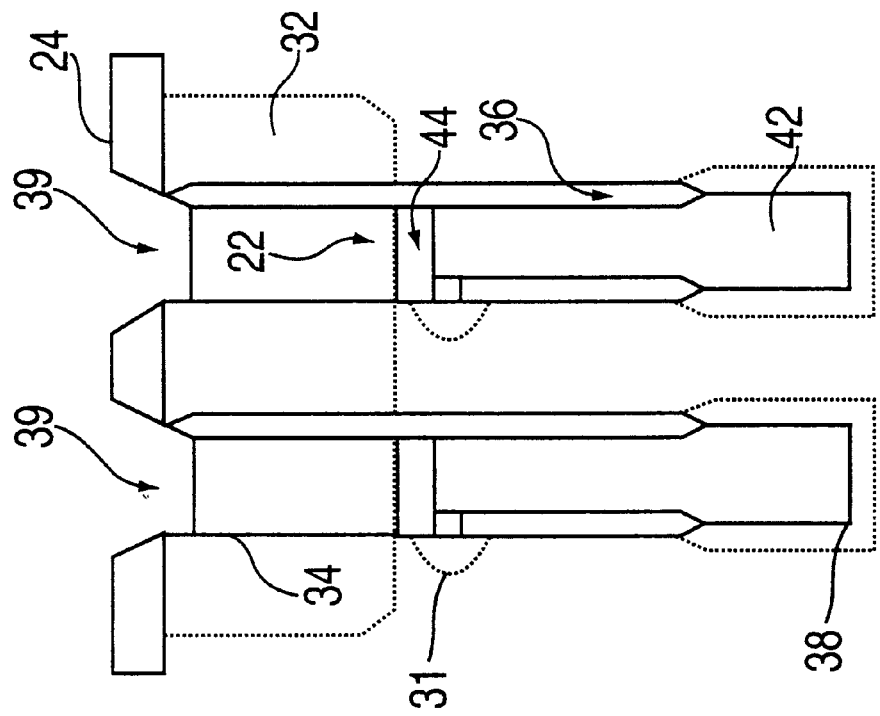
FIGS. 5–9 show process steps for forming an improved vertical MOSFET.

As depicted in FIG. 6, the array GC polysilicon 22 then is recessed below the top surface of the silicon substrate 20 using standard etch techniques to expose the gate dielectric in recess 39.

Figure 8:
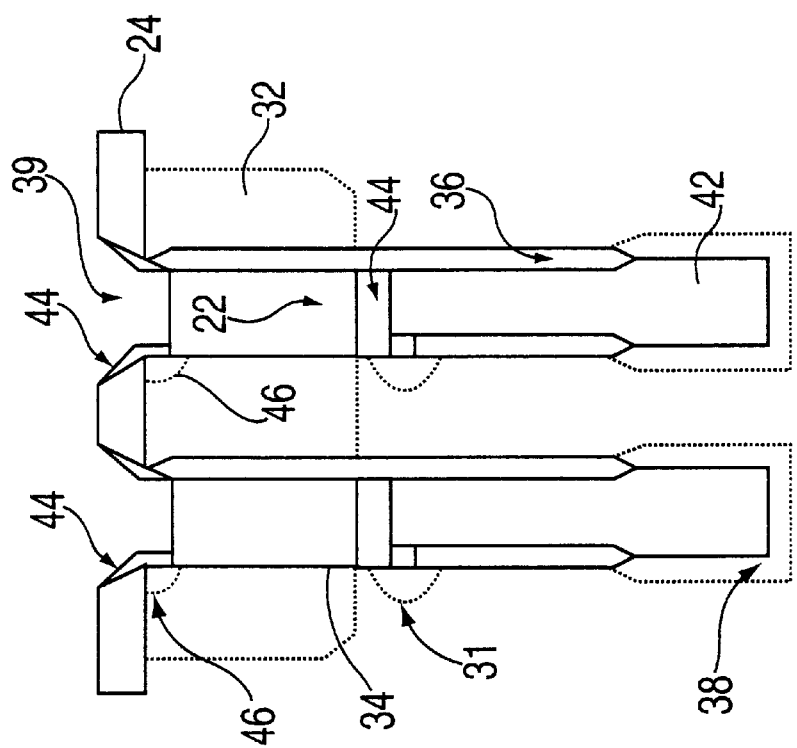
Figure 7:
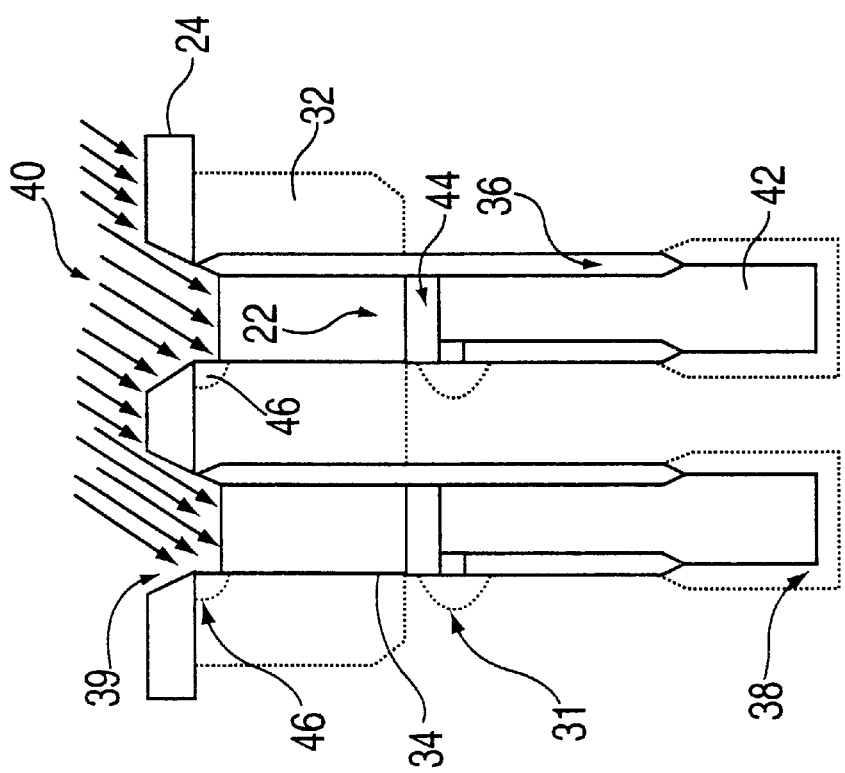

In FIG. 7, an angled implant (represented by arrows 40) of an N-type dopant species is made through the exposed gate dielectric in recess 39 and into the deep trench sidewall to form N-type doping pockets 46; which is self-aligned with the edge of the gate conductor 22. In an optional process step, shown in FIG. 8, a CVD oxide layer may be deposited and RIE'd, forming spacers 44 on the sidewalls of the apertures above the deep trenches.

Figure 9:
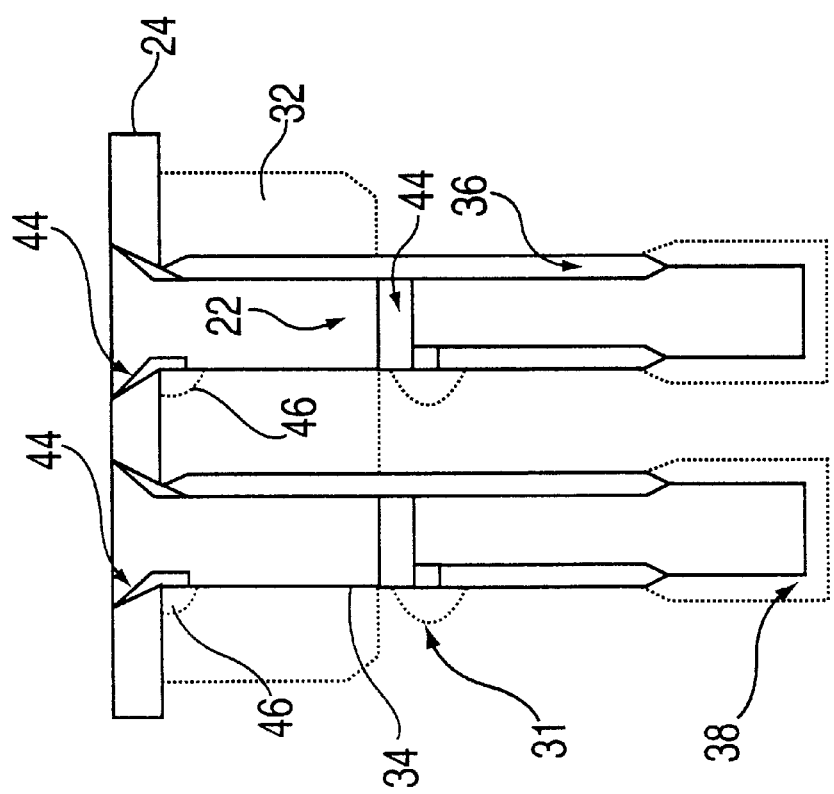

An additional layer of N+ doped polysilicon 22 then is deposited and planarized to the top surface of the TTO HDP oxide 24, as shown in FIG. 9. Following this step, standard processing techniques are applied to form wordlines, bitline studs, interlevel dielectrics, additional wiring levels, and the like.

Figure 10:
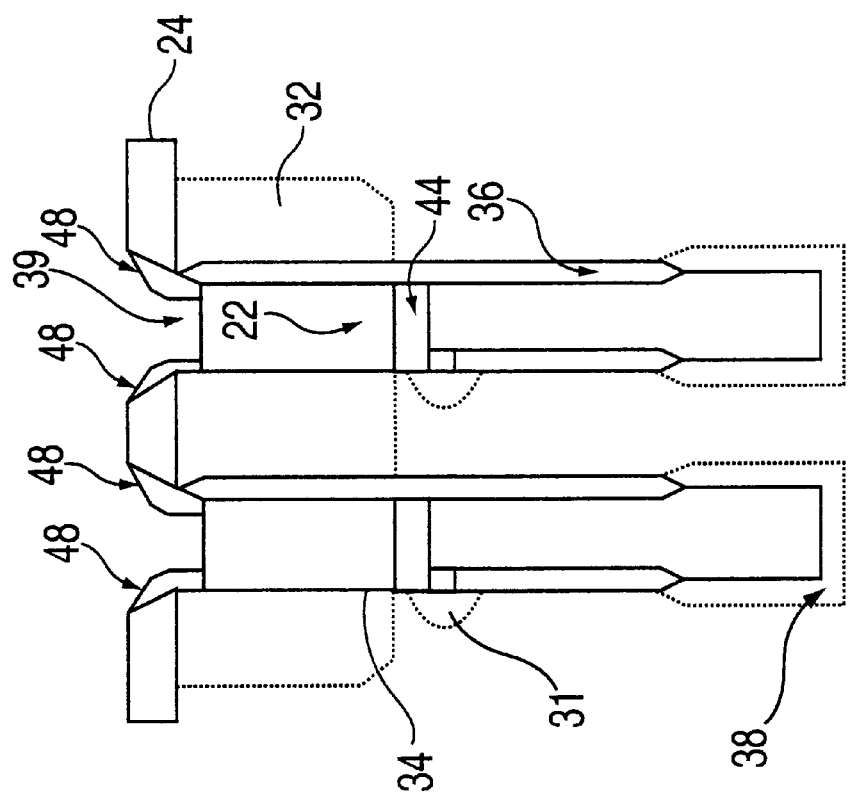
FIG. 10 depicts another embodiment of a process for forming an improved vertical MOSFET.

FIG. 10 illustrates a second embodiment of the present invention wherein a N-type doped glass, such as ASG, is deposited in the gate dielectric recess 39 of the structure shown in FIG. 5. This N-type doped glass deposit then is reactive ion etched to form doped glass spacers 48. Subsequent hot processing steps in the MOSFET DRAM fabrication process will cause the dopant from glass spacers 48 to outdiffuse and form N-type bitline diffusion pockets on the front side of the MOSFET, similar to those represented by 46 in FIGS. 7, 8 & 9. The thick oxide on the backside of the transistor blocks the formation of a diffusion pocket.

While the invention has been described in terms of two particular embodiments, those skilled in the art will appreciate that the invention maybe practiced in various versions within the spirit and scope of the following claims.

We claim:

1. A method of forming a semiconductor memory cell array structure comprising:

providing a vertical MOSFET DRAM cell structure having a deposited gate conductor layer planarized to a top surface of a trench top oxide on the overlying silicon substrate;

forming a recess in the gate conductor layer below the top surface of the silicon substrate;

implanting N-type dopant species through the recess at an angle to form doping pockets in the array P-well;

depositing a gate conductor material into said recess and planarizing said gate conductor to said top surface of the trench top oxide.

2. The method of claim 1 further comprising depositing an oxide layer into the recess and etching said oxide layer to form spacers on sidewalls of the recess prior to depositing the gate conductor material into said recess.

3. The method of claim 1 wherein said doping pockets are self-aligned with the gate conductor.

4. A method of forming a semiconductor memory cell array structure comprising:

providing a vertical MOSFET DRAM cell structure having a deposited gate conductor layer planarized to a top surface of a trench top oxide on the overlying silicon substrate;

forming a recess in the gate conductor layer below the top surface of the silicon substrate;

implanting N-type dopant species through the recess at an angle to form doping pockets in the array P-well;

depositing an oxide layer into the recess and etching said oxide layer to form spacers on sidewalls of the recess;

depositing a gate conductor material into said recess and planarizing said gate conductor to said top surface of the trench top oxide.

5. A method of forming a semiconductor memory cell array structure comprising:

providing a vertical MOSFET DRAM cell structure having a deposited gate conductor layer planarized to a top surface of a trench top oxide on the overlying silicon substrate;

forming a recess in the gate conductor layer below the top surface of the silicon substrate;

depositing an N-doped glass layer into said recess and etching said glass layer to form spacers or sidewalls of the recess;

depositing a gate conductor material into said recess and planarizing said gate conductor to said top surface of the trench top oxide.

6. The method of claim 5 wherein said N-doped glass layer is an arsenic-silicate glass material.

* * * * *